US010082447B2

(12) United States Patent
Estevo et al.

(10) Patent No.: US 10,082,447 B2
(45) Date of Patent: Sep. 25, 2018

(54) SYSTEM AND METHOD TO TEST A CONTACT OF A CONNECTOR

(71) Applicant: THE BOEING COMPANY, Chicago, IL (US)

(72) Inventors: Curtis R. Estevo, Mesa, AZ (US); Jason G. DeStories, Mesa, AZ (US); Jared C. Tompkinson, Mesa, AZ (US); Stephen Doyle, Mesa, AZ (US); David Scott S. Wright, Snohomish, WA (US)

(73) Assignee: THE BOEING COMPANY, Chicago, IL (US)

( * ) Notice: Subject to any disclaimer, the term of this patent is extended or adjusted under 35 U.S.C. 154(b) by 168 days.

(21) Appl. No.: 15/068,347

(22) Filed: Mar. 11, 2016

(65) Prior Publication Data

US 2017/0261405 A1 Sep. 14, 2017

(51) Int. Cl.
*G01M 99/00* (2011.01)
*G01R 1/00* (2006.01)

(52) U.S. Cl.
CPC ............ *G01M 99/007* (2013.01); *G01R 1/00* (2013.01); *H01R 2201/20* (2013.01)

(58) Field of Classification Search
CPC ...... G01M 99/007; G01B 21/16; G01D 11/30
USPC .......................................................... 73/818
See application file for complete search history.

(56) References Cited

U.S. PATENT DOCUMENTS

| 3,210,832 | A | * | 10/1965 | Kalen | .................. | H01R 13/424 29/278 |
| 3,879,997 | A | * | 4/1975 | Mann | ..................... | G01L 5/0057 73/862.01 |
| 4,211,108 | A | * | 7/1980 | Seitz | ...................... | G01L 5/0033 73/862.01 |
| 6,116,935 | A | * | 9/2000 | Fukuda | .................. | H01R 43/26 324/538 |
| 8,601,675 | B2 | | 12/2013 | Shelley et al. | | |
| 9,696,366 | B2 | * | 7/2017 | Schratz | ................ | G01R 31/045 |
| 2012/0019276 | A1 | * | 1/2012 | Kogasumi | ............ | G01R 31/045 324/755.01 |
| 2012/0235700 | A1 | * | 9/2012 | Iyer | ...................... | G01R 1/0458 324/756.02 |

FOREIGN PATENT DOCUMENTS

JP 2007085926 A * 4/2007

OTHER PUBLICATIONS

Wearable Soldier Electronics, retrieved from Internet at http://www.glenair.com/qwikconnect/vol10num1/coverstory.htm; Glenair, vol. 1, No. 10; Apr. 2005, (7 pages).

* cited by examiner

*Primary Examiner* — Lisa Caputo
*Assistant Examiner* — Jamel Williams
(74) *Attorney, Agent, or Firm* — Toler Law Group, P.C.

(57) ABSTRACT

A device to test a contact of a connector includes a frame and a connector adaptor coupled to the frame. The connector adaptor is configured to retain the connector. The device also includes one or more alignment actuators coupled to the frame and a piston assembly movable relative to the connector by the one or more alignment actuators. The piston assembly is configured to apply a compressive force to the contact to test a locking mechanism of the contact.

20 Claims, 8 Drawing Sheets

SYSTEM AND METHOD TO TEST A CONTACT OF A CONNECTOR

FIELD OF THE DISCLOSURE

The present disclosure is generally related to testing a contact of a connector.

BACKGROUND

Many systems utilize wiring to route power, electrical signals, etc. To simplify manufacturing and maintenance of such systems, several wires may be coupled together to form a wire bundle. For example, a set of wires that extends from one device to another device may be assembled into a wire bundle so that each of the individual wires do not have to be routed independently. If a particular set of wires is intended to connect to a single device, it may be convenient to terminate the wire bundle with a connector such that each wire corresponds to a contact of the connector. The connector may allow all of wires of the particular set of wires to be connected to (or disconnected from) the single device at the same time. Such wire bundle and connector arrangements are common, for example, in aircraft, automobiles, building systems (e.g., air conditioning and heating systems, etc.), and many other fields. Despite the prevalence of wire bundle and connector arrangements, testing schemes for assembled wire bundles and connectors are generally manual.

SUMMARY

In a particular embodiment, a device to test a contact of a connector includes a frame and a connector adaptor coupled to the frame. The connector adaptor is configured to retain the connector. The device also includes one or more alignment actuators coupled to the frame and a piston assembly movable relative to the connector by the one or more alignment actuators. The piston assembly is configured to apply a compressive force to the contact to test a locking mechanism of the contact.

In another particular embodiment, a method to test a contact of a connector includes sending a first signal from a controller of a test device to one or more alignment actuators of the test device. The first signal causes the one or more alignment actuators to align a piston assembly of the test device with the contact of the connector. The method also includes, after the piston assembly is aligned with the contact, sending a second signal from the controller to a test actuator of the test device. The second signal causes the test actuator to actuate the piston assembly to apply a compressive force to the contact to test a locking mechanism of the contact.

The features, functions, and advantages that have been described can be achieved independently in various implementations or may be combined in yet other implementations, further details of which are disclosed with reference to the following description and drawings.

DETAILED DESCRIPTION

Figure 1:
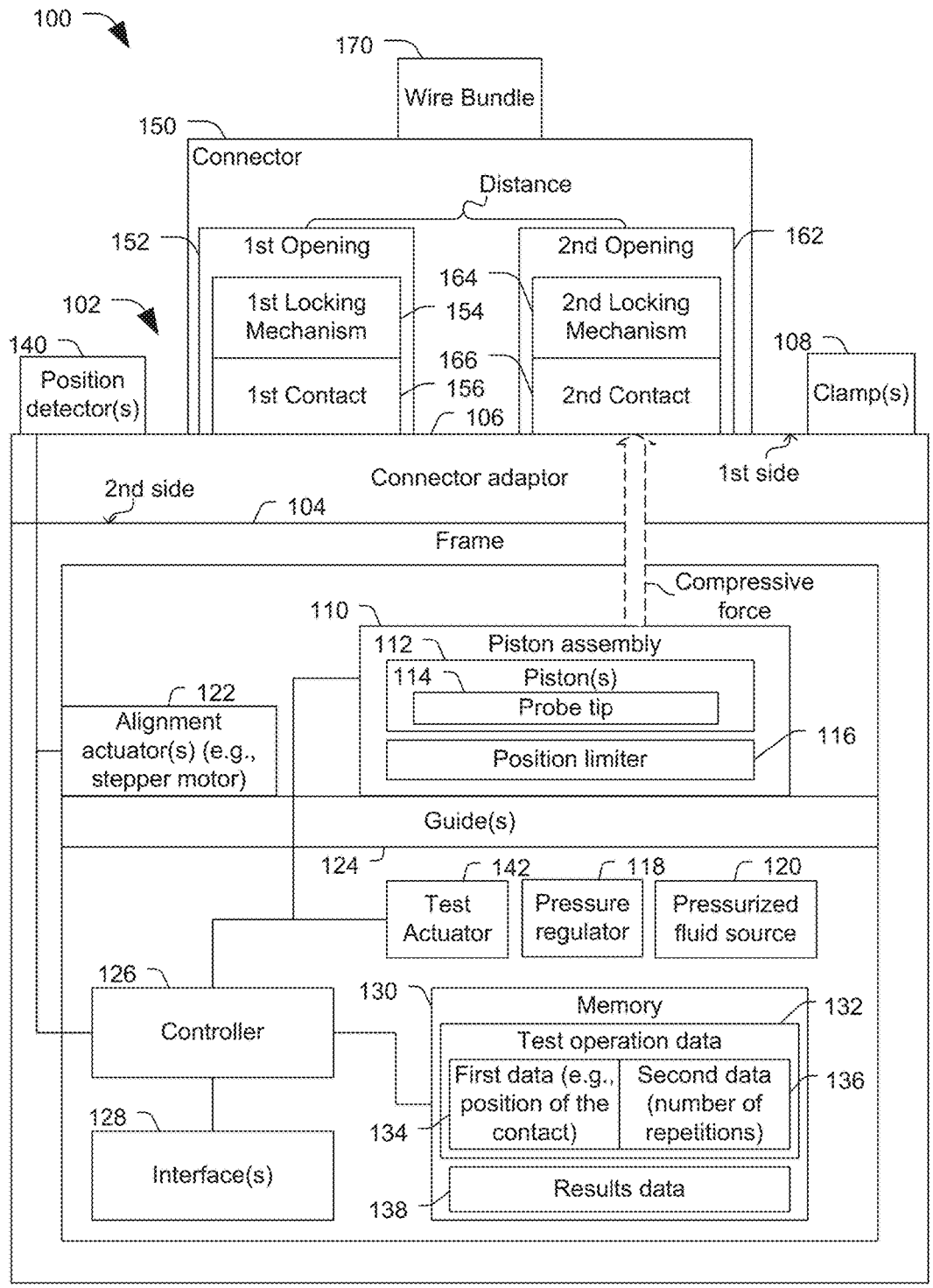
FIG. 1 is a block diagram of a system that includes a device to test a contact of a connector, according to a particular embodiment.

FIG. 1 illustrates is a block diagram of a system 100 that includes a device 102 to test a contact of a connector 150, according to a particular embodiment.

The connector 150 includes a plurality of contacts 156, 166 (e.g., pin contacts, socket contacts, or a combination thereof). For example, the connector 150 may include a body (such as a body 202 of FIG. 2A) defining a plurality of openings (such as a first opening 152 and a second opening 162). A mating surface of the connector 150, which is adjacent the connector adaptor 106 in FIG. 1, is configured to couple to a mating surface of another connector 150. When the connector 150 is coupled to the other connector, at least some of the contacts 156, 166 of the connector 150 are electrically connected to a corresponding set of contacts of the other connector (e.g., enable signals, power, or both, to be communicated via the pair of connectors). At least some of the contacts 156, 166 of the connector 150 are coupled to a corresponding wire of a wire bundle 170 coupled to the connector 150. The wire bundle 170 may extend from a different side of the body 202 of the connector 150 than the mating surface. For example, in FIG. 1, the wire bundle 170 extends from a side of the connector 150 that is opposite the mating surface. However, in other examples, the wire bundle 170 may extend from a different side of the connector 150 (e.g., to form an angle from 0 deg. to 90 deg. relative to a normal of the mating surface).

Each contact 156, 166 is disposed within a respective opening 152, 162 and is retained in the opening 152, 162 by a locking mechanism 154, 164. For example, the first contact 156 is retained in the first opening 152 by the first locking mechanism 154, and the second contact 166 is retained in the second opening 162 by the second locking mechanism 164. In some implementations, the connector 150 has a standardized form factor (e.g., shape, number of openings, etc.). In such implementations, the body may include more openings than are needed. In such implementations, some of the openings 152, 162 of the connector 150 may not include a contact.

Generally, the connector 150 is assembled by inserting each of the contacts 156, 166 into the body 202 of the connector 150 until the locking mechanism 154, 164 is engaged. For example, the first contact 156 may be physically and electrically attached to a wire (e.g., by soldering, crimping, etc.). The first contact 156 may be inserted into the first opening 152 of the connector 150 and pushed in until the first contact 156 extends far enough into the connector 150 for the first locking mechanism 154 to engage. If the first contact 156 is not inserted far enough or if the first locking mechanism 154 fails to engage (e.g., due to the first contact 156 or the connector 150 being damaged or contaminated), the connector 150 may appear to be assembled correctly; however, the first contact 156 may later become loose (e.g., by workings its way at least partially out of the connector 150), which may lead to loss of an electrical connection. If the first contact 156 only works its way partially out of the connector 150, the connector 150 may continue to appear correctly assembled making visual identification of the loose contact difficult. During assembly, an operator may pull on a wire to determine whether a contact connected to the wire is locked in the connector 150. However, this is a time-consuming process that is generally not repeatable (e.g., because the amount of force applied by the operator to the wire can vary from test to test). The device 102 enables automated testing of the contacts 156, 166 by applying a compressive force (as opposed to the tensile force used when the wire is pulled to test the locking mechanism) to each of the contacts 156, 166 (or to a sampled set of the contacts 156, 166) to verify that the locking mechanisms 154, 164 are engaged. Automating the testing of the connector 150 saves time as well as enabling more standardized and repeatable testing processes.

The device 102 includes a frame 104 and a connector adaptor 106 coupled to the frame 104. The device 102 also includes a piston assembly 110 movable relative to the connector 150 by one or more alignment actuators 122. For example, the alignment actuators 122 may move the piston assembly 110 in an X-Y plane, as illustrated in FIGS. 2A-2E. The piston assembly 110 is configured to apply the compressive force to each of the contacts 156, 166 to test the locking mechanisms 154, 164. For example, the piston assembly 110 may include a piston 112 that is movable in a Z-direction, as illustrated in FIGS. 2A-2E. The piston 112 includes a probe tip 114 configured to fit within the openings 152, 162 and press on an end of a contact.

The alignment actuators 122, the piston assembly 110, other components of the device 102, or a combination thereof, may be controlled by a controller 126. For example, the controller 126 may send signals to the alignment actuators 122, to a test actuator 142 coupled to the piston assembly 110, to other components of the device 102, or to a combination thereof, to initiate or control testing of the connector 150. Additionally, the controller 126 may generate results data 138 based on the test. For example, the controller 126 may be coupled to a position detector 140 (or position detectors) that may detect displacement of one of the contacts 156, 166 due to the compressive force. The position detector 140 may provide a signal indicating the displacement to the controller 126, which may generate the results data 138 based on the signal. The results data 138 may include simple pass/fail indications or more detailed results, such as a measurement of the displacement (e.g., in length units or as a fraction or percentage of allowable displacement).

The connector adaptor 106 (which may also be referred to as a connector shell) is configured to retain the connector 150. For example, the connector adaptor 106 may include fittings, recesses, projections, or other features configured to couple to the connector 150. To illustrate, connector 150 may be a female type connector that includes ring having a threaded inner surface encircling the mating surface, and the connector adaptor 106 may include a retaining mechanism that is shaped like a corresponding male connector (e.g., having ring with a threaded outer surface) so that the retaining mechanism holds the connector 150 in place. Additionally, the connector adaptor 106 allows the piston assembly 110 to access the contacts. For example, the connector adaptor 106 may have a single opening corresponding to a mating interface of the connector 150. In other examples, the connector adaptor 106 may have an individual opening for each contact or for each contact to be tested, may have several openings with each opening corresponding to a group of contacts, or may have another configuration that allows the piston assembly 110 to access at least some of the contacts 156, 166 of the connector 150.

In some embodiments, to enable the device 102 to be used to test different types of connectors, the connector adaptor 106 is removable. For example, one or more clamps 108 may removeably couple the connector adaptor 106 to the frame 104. Alternately, or in addition, the connector adaptor 106 may be configured to retain several different types of connectors. To illustrate, the connector adaptor 106 may have a first feature (e.g., a first retaining mechanism and first contact openings) to couple to a first connector type and a second feature (e.g., a second retaining mechanism and second contact openings) to couple to a second connector type. The different types of connectors may differ in shape, number of contacts, location of contacts, spacing between contacts, etc.

In a particular implementation, an identifier may be associated with each connector adaptor, and test operation data 132 may be generated or accessed based on the identifier. For example, an operator may input the identifier of the connector adaptor 106 (e.g., manually or by scanning text, a code, or an RFID chip of the connector adaptor 106). Since the connector adaptor 106 may be configured to retain a specific type of connector (e.g., the connector 150), the identifier may be used to determine, for example, locations of contacts of the connector 150, types of contacts (e.g., pin or socket), test parameters (e.g., a magnitude of the compressive force or a position limiter setting).

The piston 112 is coupled to a test actuator 142. During operation, the test actuator 142 actuates the piston 112 (e.g., to cause the piston 112 to move to apply the compressive force). In a particular implementation, the piston 112 is electromechanically actuated, in which case the test actuator 142 may include a relay or switch. In other implementations, the piston 112 may be fluid driven (e.g., pneumatically-actuated or hydraulically-actuated), in which case the test actuator 142 may be a valve or solenoid. When the piston 112 is fluid driven, the test actuator 142 may be coupled to a pressure regulator 118 and to a pressurized fluid source 120. The pressurized fluid source 120 may include a pump, a compressor, a pressurized fluid storage reservoir, or a combination thereof. In other implementations, a compressor or pump that provides pressurized fluid may be external to the device 102. In such implementations, the pressurized fluid source 120 illustrated in FIG. 1 may correspond to a connector configured to connect to the compressor or pump via a pressurized fluid line (e.g., an air hose or a hydraulic line).

The pressure regulator 118 may be configured to control a magnitude of the compressive force applied by the piston 112 to the contacts 156, 166. When the piston 112 is fluid driven, the pressure regulator 118 may adjust a pressure of the pressurized fluid supplied to the piston 112 to control the magnitude of the compressive force. When the piston 112 is electromechanical, a current regulator or voltage regulator or another electromechanical limiter may be used in place of the pressure regulator 118.

The piston assembly 110 may also include a position limiter 116. The position limiter 116 may limit a range of motion of the piston 112 (or the probe tip 114). Different connector types may have openings of different depths or different types of locking mechanisms. The position limiter 116 may be adjustable so that the range of motion of the piston 112 (or the probe tip 114) is sufficient to allow the probe tip 114 to apply the compressive force to the contacts of the particular connector that is being tested (e.g., the connector 150). In a particular example, the position limiter 116 includes or corresponds to a reed switch. In this example, the reed switch may send a signal to the controller 126, to the test actuator 142, or to both, when the piston 112 reaches a particular position. In response, the test actuator 142 may cause the piston 112 to stop applying the compressive force (or to stop moving in the Z-direction as illustrated in FIGS. 2A-2E). In other examples, the position limiter 116 may include or correspond to a physical obstacle (such as a set screw) that blocks or impedes motion of the piston 112 past a particular limit.

The piston assembly 110 may be coupled to one or more guides 124. The guides 124 may restrain movement of the piston assembly 110 to substantially linear motion to facilitate reliable and repeatable positioning of the piston assembly 110. Additionally, the piston assembly 110 may be coupled to the alignment actuators 122. The alignment actuators 122 may move the piston assembly 110 along the guides 124 to align the probe tip 114 with the opening (e.g., the second opening 162) of a contact (e.g., the second contact 166) to be tested. The alignment actuators 122 may include electromechanical or fluid-driven actuators. For example, the alignment actuators 122 may include one or more stepper motors. In this example, alignment of the probe tip 114 with the opening of the second contact 166 may be determined based on a number of stepper motor counts. To illustrate, using the embodiment illustrated in FIGS. 2A-2E as an example, a first stepper motor (e.g., a horizontal stepper motor 260) may be coupled to the piston assembly 110 to move the piston assembly 110 in an X-direction (e.g., along horizontal guides 242 in the view illustrated in FIG. 2A). A second stepper motor (e.g., a vertical stepper motor 272) may be coupled to the piston assembly 110 to move the piston assembly 110 in a Y-direction (e.g., along vertical guides 224 in the view illustrated in FIG. 2A). A limit switch 270 (shown in FIG. 2E) may be configured to provide a "home" signal indicating when the piston assembly 110 is at a known position (e.g., at a bottom left position in the view illustrated in FIG. 2B). From the home position, a number of stepper motor counts to other positions may be determined based on calibration data. Thus, the controller 126 may zero the position of the piston assembly 110 by causing the alignment actuators 122 to move the piston assembly 110 down and to the left until the limit switch 270 is actuated. Subsequently, the controller 126 may count a number of turns of each of the alignment actuators 122 to track a position of the piston assembly 110. Thus, when the controller 126 determines to move the piston assembly 110 from being aligned with the first opening 152 to being aligned with the second opening 162, the controller 126 may calculate a number of turns (or partial turns) of each of the alignment actuator 122 to move the probe tip 114 the distance betwepn the openings 152, 162.

The device 102 may also include one or more interfaces 128 coupled to the controller 126. The interfaces 128 may include user interfaces, machine interfaces, or both. The user interfaces may include input devices, such as buttons, knobs, switches, touch-screen devices, keyboards, keypads, cameras or scanners, microphones, cursor control devices (e.g., a mouse, trackball or trackpad), or a combination thereof. The user interfaces may also, or in the alternative, include output devices, such as lights, electromechanical devices, display screens, audio output devices, haptic output devices, or a combination thereof. The machine interfaces may include serial or parallel buses or other data interfaces that enable direct or network-based machine-to-machine communication.

In a particular implementation, test operation data 132 may be provided to the device 102 via the interfaces 128. For example, after a set of tests to be performed is determined, the set of tests may be used to generate data that is stored in the memory 130 as at least a portion of the test operation data 132. The test operation data 132 may include, for example, first data 134 that indicates positions of contacts to be tested. The controller 126 may use the first data 134 (along with calibration data which may also be stored at the memory 130) to control the alignment actuators 122 to move the piston assembly 110 into alignment with a contact that is to be tested (e.g., the first contact 156). The test operation data 132 may also include second data 136 that specifies a number of times that a particular contact is to be tested. For example, the compressive force may be applied to the first contact 156 a particular number of times based on the second data 136. Applying the compressive force multiple times may improve statistical significance or reliability of the results data 138. The test operation data 132 may also include other information, such as calibration data, data that specifies the magnitude of the compressive force (e.g., a pressure regulator setting), data that specifies a displacement limit of the piston 112 (e.g., a position limiter setting), data that specifies how the results data 138 are to be determined (e.g., a pass or fail criterion), etc.

The device 102 may also include or be associated with position detector 140. The position detector 140 may be configured to detect movement of wires (or contacts) of the connector 150 during testing. Based on the detected movement, the position detector 140 may generate a signal that indicates or is associated with results of testing a contact. For example, the position detector 140 may measure displacement of the second contact 166 (or a wire coupled to the second contact 166) when the compressive force is applied to the second contact 166. The position detector 140 may send the signal to the controller 126, which may compare the measured displacement with a displacement limit (e.g., a pass or fail criterion) to determine the results data 138. Alternatively, data specifying the measured displacement may be stored as the results data 138. In another example, the position detector 140 may send the signal to the controller 126 if a contact (or a wire attached to the contact) moves more than a threshold amount responsive to the compressive force.

During operation, the connector adaptor 106 is coupled to the frame 104 of the device 102, and the connector 150 is coupled to the connector adaptor 106. An operator or a computing device external to the device 102 provides the test operation data 132 (or a portion of the test operation data 132) to the device 102 via the interfaces 128. The test operation data 132 identifies a contact or a set of contacts to be tests. For example, the test operation data 132 may include the first data 134, which may indicate a position of the first contact 156 to be tested). The test operation data 132 may also include settings associated with the test sequence, which the controller 126 may use to configure the device 102 for the test sequence. For example, the test operation data 132 may indicate a magnitude of the compressive force, and the controller 126 may configure the pressure regulator 118 based on the magnitude of the compressive force. As another example, the test operation data 132 may indicate a displacement limit of the piston 112 or the probe tip 114, and the controller 126 may configure the position limiter 116 based on the displacement limit. As another example, the test operation data 132 may indicate a test pass or fail criterion, and the controller 126 may configure the position detector 140 based on the test pass or fail criterion.

In some implementations, the test operation data 132 includes parameters (such as the first data 134) for multiple different types of connectors. In such implementations, a subset of the test operation data 132 may be selected to define the test sequence. For example, input may be received via the interfaces 128 to select the subset of the test operation data 132. In this example, the input may specify a connector type, a test sequence identifier (e.g., a name or number associated with a particular test sequence) or other information to select the test sequence. Additionally or in the alternative, information identifying the connector adaptor 106 may be used to select the subset of the test operation data 132. The information identifying the connector adaptor 106 may be provided to the controller 126 automatically or manually via the interfaces 128. To illustrate, the interfaces 128 may include a scanner or RFID interrogator that automatically determines the identifier of the connector adaptor 106 based on a code or RFID tag on the connector adaptor 106. In another illustrative example, the connector adaptor 106 may include a human-readable code (e.g., text or numbers) that identify the connector adaptor 106, and an operator may use the interfaces 128 to input the human-readable code to identify the connector adaptor 106 to the controller 126.

The test sequence is initiated based on input receive via the interfaces 128. During the test sequence, the controller 126 determines a location of a contact to be tested and movement of the piston assembly 110 to align the probe tip 114 with the contact. For example, the location of the first contact 156 may be specified in the test operation data 132 (e.g., in the first data 134), and the controller 126 may determine movement of the piston assembly 110 based on a currently location of the piston assembly 110 and the location of the first contact 156. Occasionally (e.g., periodically or in response to an event, such as at the beginning of the test sequence), the controller 126 may recalibrate the position of the piston assembly 110 by causing the piston assembly 110 to move to a known and detectable location, such as to the position of the limit switch 270 illustrated in FIG. 2E. When the position of the piston assembly 110 is known, the controller 126 may access calibration data from the memory 130 to determine movements of the alignment actuators 122 to move the piston assembly 110 into alignment with a contact to be tested. For example, the position of the piston assembly 110, the position of the first contact 156, and calibration information indicating an amount of movement of the piston assembly 110 associated with each stepper motor turn may be used to determine a number of stepper motor turns to align the piston assembly 110 with the first contact 156.

The controller 126 may send one or more signals to the alignment actuators 122 to cause the alignment actuators 122 to move the piston assembly 110 into alignment with the contact to be tested. After the piston assembly 110 is aligned with the contact to be tested, the controller 126 sends a signal to the test actuator 142 to cause the piston assembly 110 to apply the compressive force to the contact. Based on the signal, the test actuator 142 causes the piston 112 to move toward the contact. For example, the test actuator 142 may open a valve to provide a pressurized fluid to the piston 112. As the piston 112 moves, the probe tip 114 enters an opening (e.g., the first opening 152) and applies the compressive force to the contact (e.g., to the first contact 156).

The contact may move when subject to the compressive force, but will not move beyond an allowable range if the locking mechanism is engaged and remains engaged. An operator, the position detector 140, or both, observe the contact (or a wire attached to the contact) as the compressive force is applied to determine a test result of applying the compressive force. For example, the position detector 140 may send a signal indicating the test result (e.g., pass or fail) to the controller 126, and the controller 126 may store the test result at the memory 130 as a portion of the results data 138. In another example, the position detector 140 may send a signal indicating a measurement (e.g., an amount of displacement of the contact or the wire based on application of the compressive force) to the controller 126, and the controller 126 may determine a portion of the results data 138 based on the measurement.

After application of the compressive force to the contact, the device 102 proceeds with subsequent tests of the test sequence. The subsequent tests may include testing other contacts or testing other connectors. For some test sequences, the subsequent tests may include performing additional tests on the same contact. For example, the test operations data 132 may include the second data 136, which indicates a number of tests to be performed for each contact to be tested. In one example, the second data 136 may be received at the controller 126 via the interfaces 128. To illustrate, an operator or a computer may indicate that the first contact 156 is to be tested a specified number of times and that the second contact 166 is to be tested the same number of times or a different number of times. In another example, the controller 126 may determine the second data 136. In this example, the controller 126 (or the memory 130) may include instructions to set up a test sequences by selecting contacts to be tested and by selecting a number of times to test each contact. In this example, the number of times to test each contact may be determined randomly, pseudo-randomly or based on a testing specification. The testing specification may indicate a minimum number of test repetitions for each contact, a maximum number of test repetitions for each contact, a distribution of the number of test repetitions for a set of contacts, or a combination thereof.

After completing the test sequence (or a particular test of the test sequence) the controller 126 generates output indicating the results data 138. For example, the controller 126 may send a signal to the interfaces 128 to cause the results data 138 or a notification based on the results data 138 (e.g., a pass or fail notification) to be sent to another computer. As another example, the controller 126 may send a signal to the interfaces 128 to cause an output device of the interfaces 128 to generate output based on the results data 138. To illustrate, if the first contact 156 passed a test (or set of tests), the controller 126 may cause a green light of the interfaces 128 to be illuminated or may cause an audio output device to generate a first tone. As another illustrative example, if the first contact 156 failed the test (or the set of tests), the controller 126 may cause a red light of the interfaces 128 to be illuminated or may cause the audio output device to generate a second tone.

Thus, the device 102 enables automated testing of the contacts 156, 166 of the connector 150. The automated testing is repeatable because the amount of force used to test each of the contacts 156, 166 can be controlled. Further, the automated testing can be performed in a manner that allows statistically reliable sampling, which improve (or document) overall reliability of connectors subjected to the testing.

FIGS. 2A-2E illustrate various views of one particular embodiment of the device 102 of FIG. 1. Although the various views in FIGS. 2A-2E illustrate details of one particular embodiment, the details of FIGS. 2A-2E should not be understood as limiting. For example, in FIGS. 2A-2E the piston 112 is pneumatically driven; accordingly, components to support a pneumatically-driven piston 112 are also shown. However, as described above, in other embodiments, the piston 112 is electromechanically driven or hydraulically driven. Thus, various implementations of the device 102 are enabled by the disclosure. These various implementations may include more components than are illustrated in FIGS. 2A-2E, fewer components than are illustrated in FIGS. 2A-2E, or one or more different components than are illustrated in FIGS. 2A-2E. Where a component illustrated in FIGS. 2A-2E corresponds to a component described with reference to FIG. 1, the component is assigned the same reference number as used in FIG. 1 unless using the same reference number would lead to confusion (e.g., if more than one component in FIGS. 2A-2E corresponds to a single component in FIG. 1).

Figure 2A:
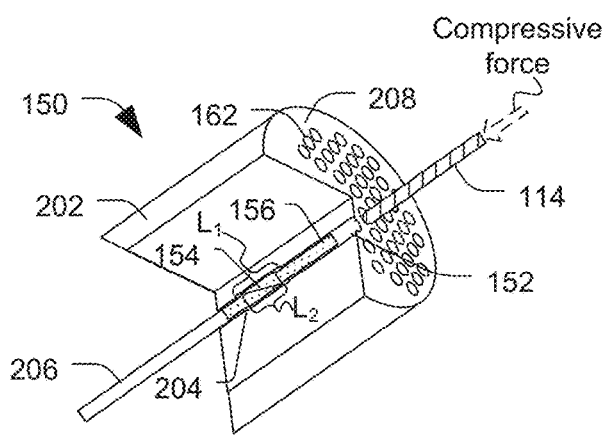
FIG. 2A is an illustration of a perspective view of a particular embodiment of the device of FIG. 1 and a cutaway perspective view of a particular connector.
Figure 2A:
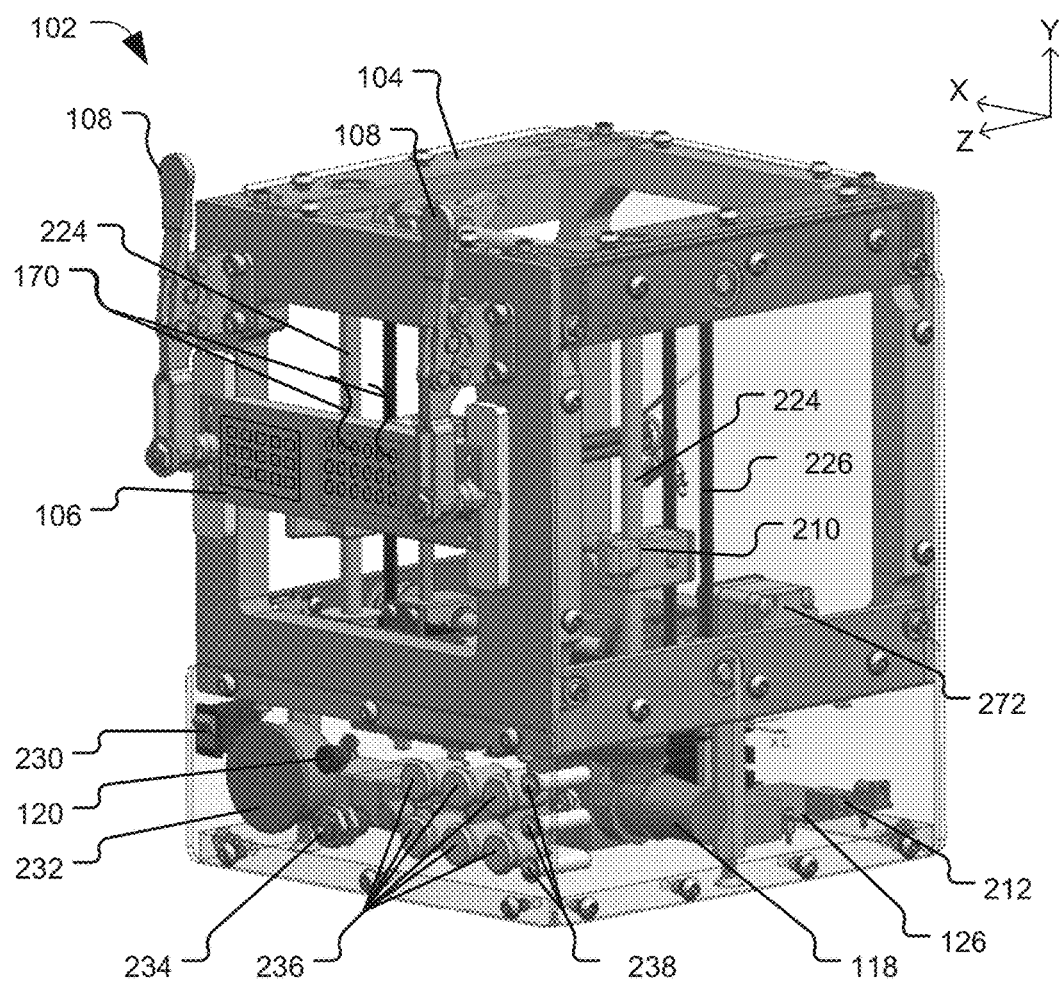
Figure 2B:
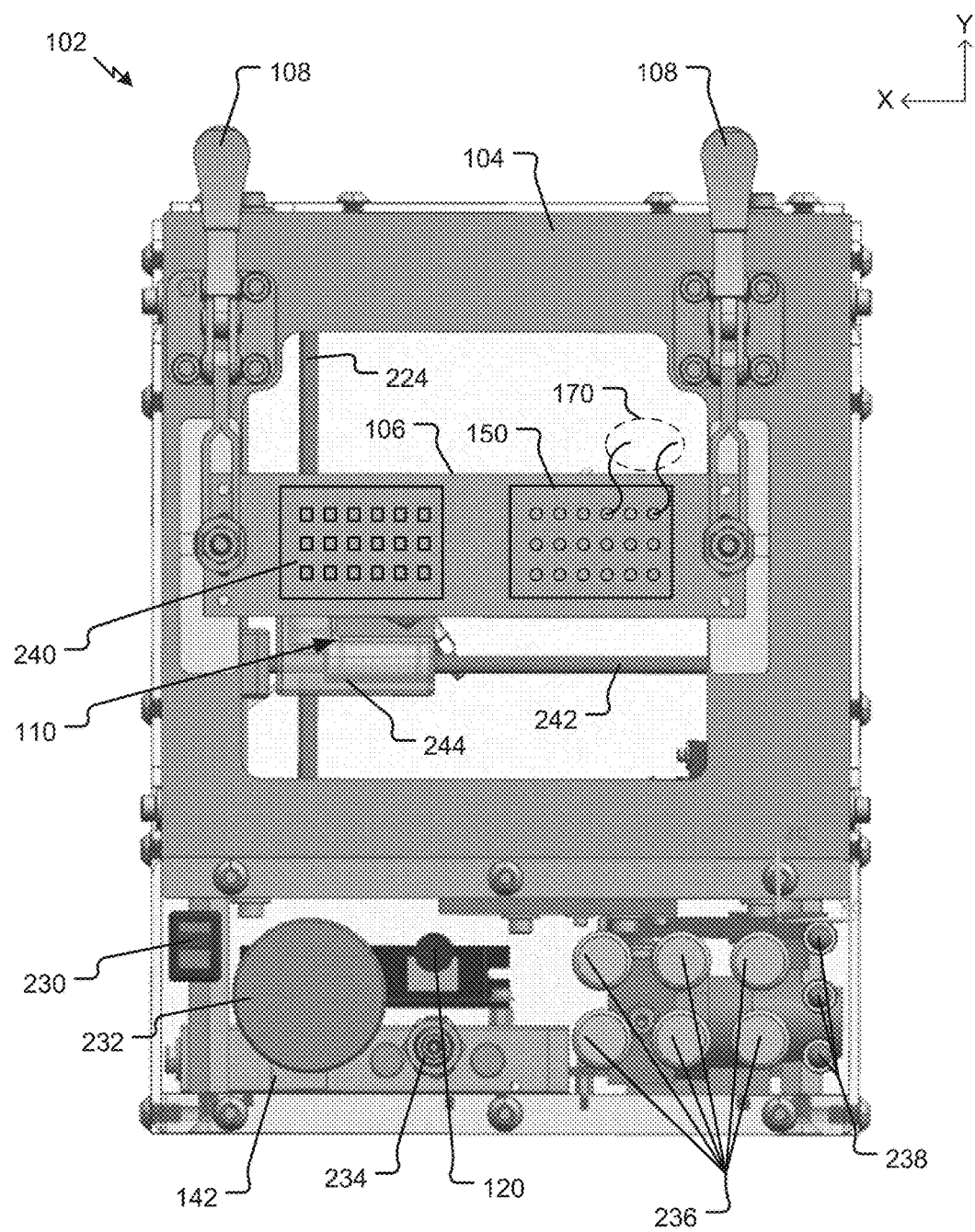
FIG. 2B is an illustration of a front view of the device of FIG. 2A.
Figure 2C:
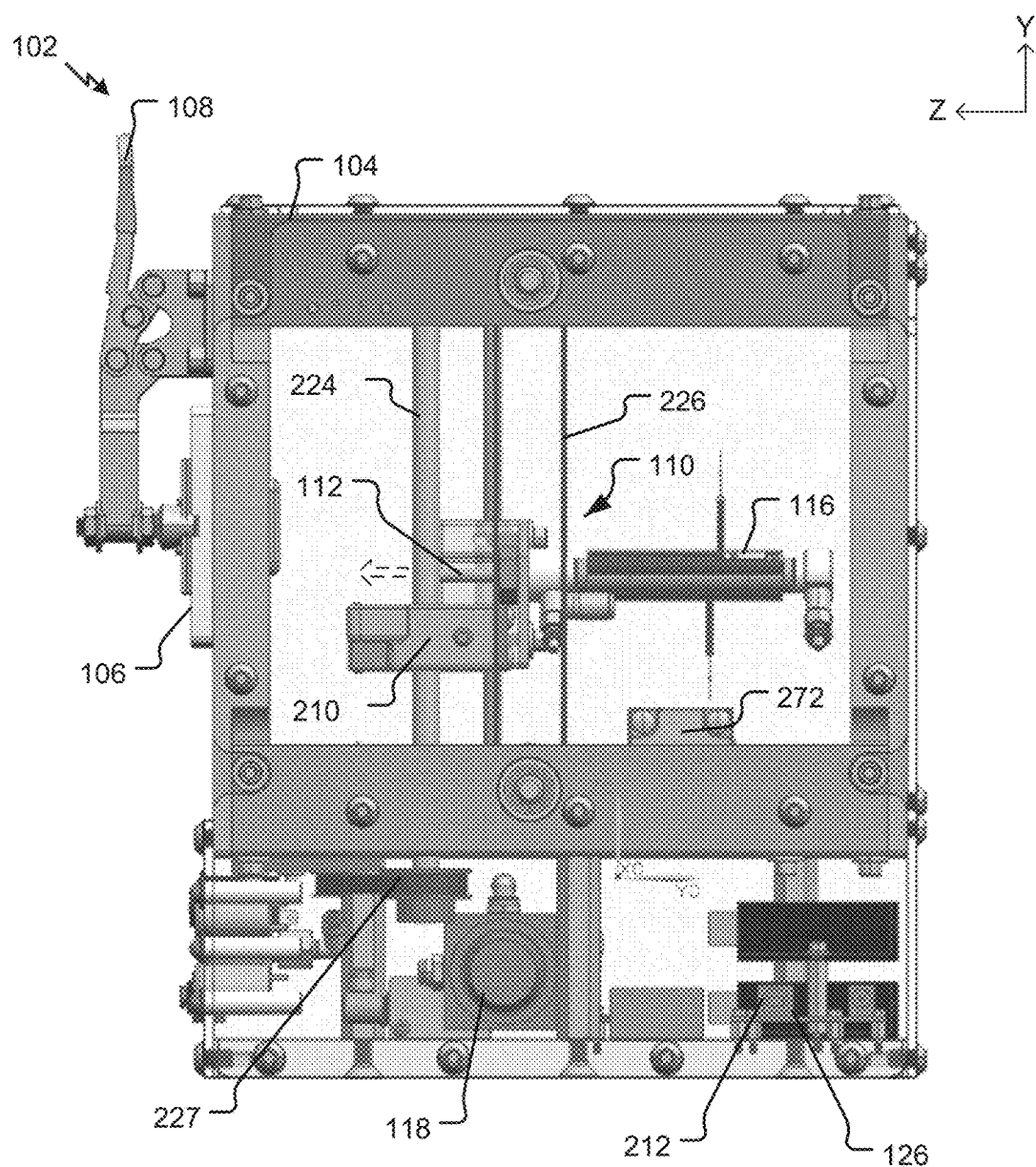
FIG. 2C is an illustration of a side view of the device of FIG. 2A.
Figure 2D:
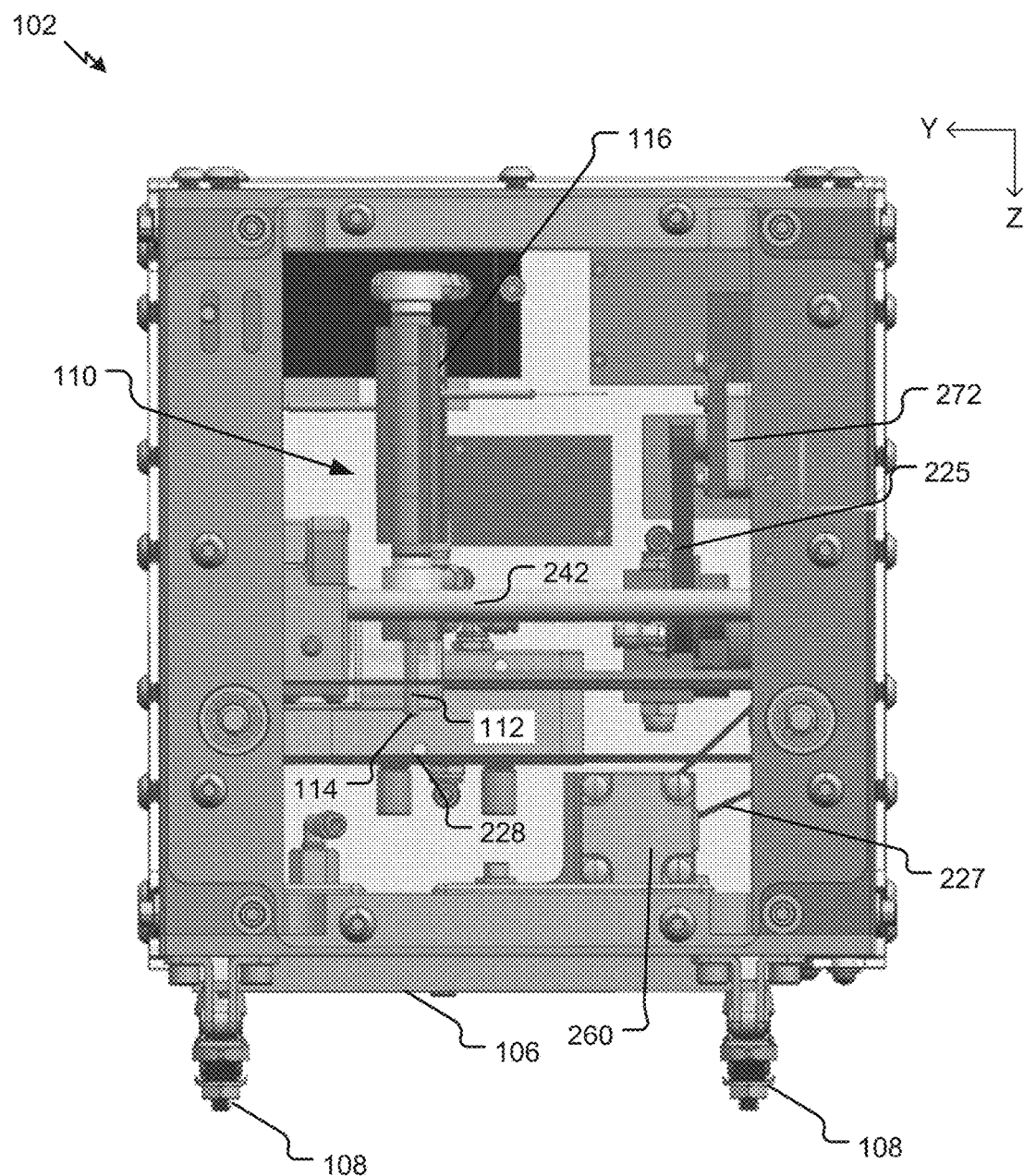
FIG. 2D is an illustration of a top view of the device of FIG. 2A.
Figure 2E:
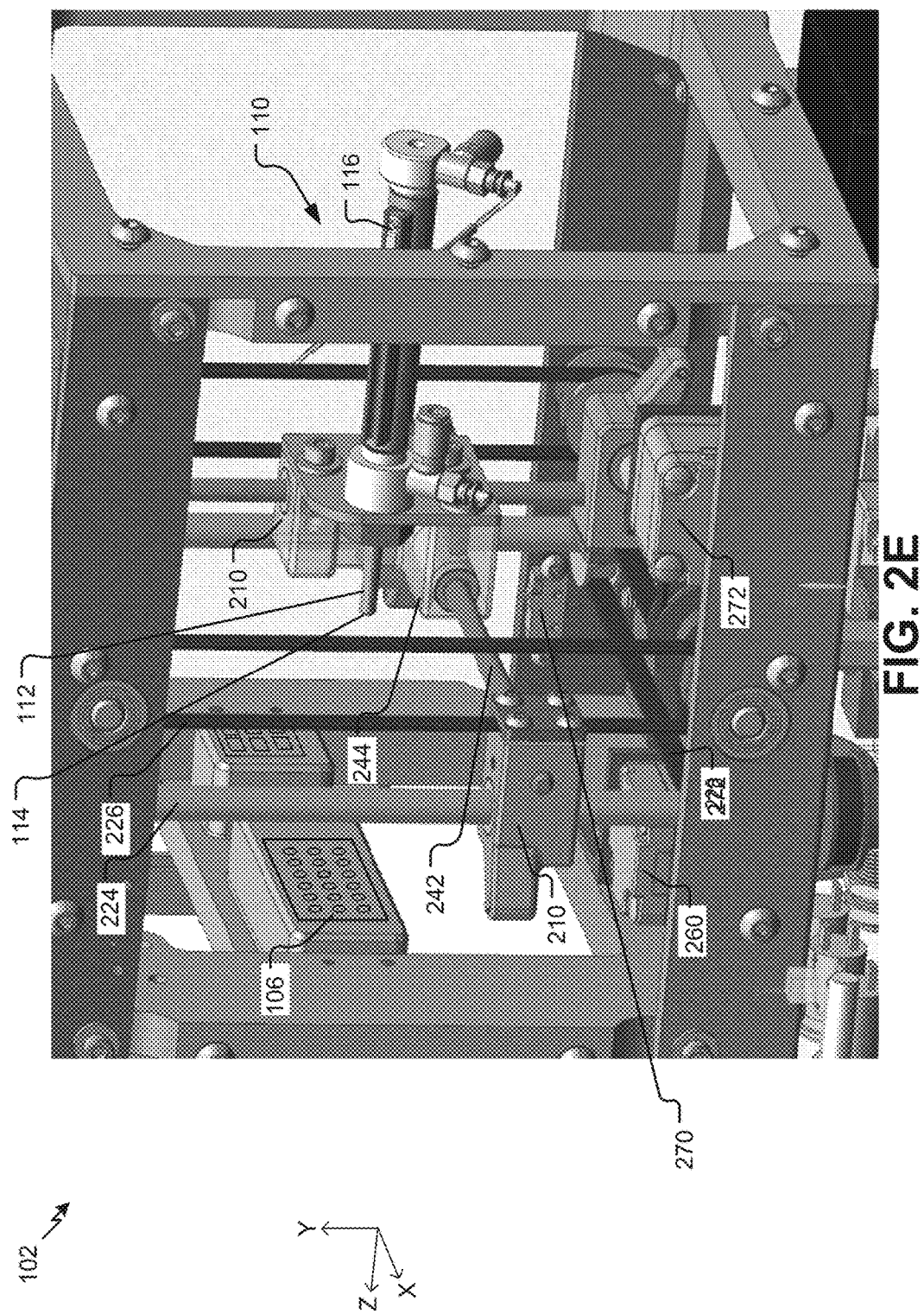
FIG. 2E is an illustration of a perspective view of a portion of the device of FIG. 2A.

FIG. 2A illustrates a cutaway perspective view of an embodiment of the connector 150 that may be tested using the device 102. The connector 150 includes a body 202, a portion of which is cut away in FIG. 2A to reveal the first opening 152. The body 202 defines a plurality of other openings, such as the second opening 162, which may be structurally similar to the first opening 152. The first opening 152 is sized to receive the first contact 156, which is coupled to a wire 206. The first contact 156 includes the first locking mechanism 154, which is configured to engage a portion of the first opening 152 to inhibit removal of the first contact 156 from the first opening 152 after insertion of the first contact 156 in the first opening 152. The connector 150 may also include a retaining mechanism (not shown), such as a threaded ring, a clip, etc.

In the example illustrated in FIG. 2A, the first opening 152 has a main diameter along its length (e.g., in a direction between the mating surface 208 and the wire 206). The first opening 152 also has an expanded area with a larger diameter than the main diameter. Thus, the first opening 152 defines a shelf or ridge 204. The first locking mechanism 154 is configured to engage by expanding within the expanded area such that, when the first locking mechanism 154 is engaged, the first locking mechanism 154 has a dimension (e.g., a diameter) that is larger than the main diameter of the first opening 152. Thus, if the first locking mechanism 154 is properly engaged, the first contact 156 can move within the connector 150 by an amount corresponding to a difference between a length, L1, of the expanded region and a length, L2, of the first locking mechanism 154. When the first contact 156 is subjected to compressive force by the probe tip 114, movement of the first contact 156 by more than the difference between L1 and L2 indicates failure of the first locking mechanism 154 or that the first locking mechanism 154 was not properly engage during assembly of the connector 150 (e.g., the first contact 156 was not inserted far enough into the first opening 152 to engage the first locking mechanism 154).

In the example illustrated in FIGS. 2A-2E, the device 102 includes a plurality of vertical guides 224 and a plurality of horizontal guides 242. The piston assembly 110 is coupled to the vertical guides 224 by one or more vertical piston assembly carriers 210 and is coupled to the horizontal guides 242 by one or more horizontal piston assembly carriers 244.

The piston assembly carriers 210, 244 may include bearings (e.g., linear bearings) that facilitate motion of the piston assembly 110 along the guides 224, 242. The guides 224, 242 are arranged to enable movement of the piston assembly 110 within a plane corresponding to or parallel to the X-Y plane.

The piston assembly 110 is coupled to alignment actuators 122, which are stepper motors in the example illustrate in FIGS. 2A-2E, by drive belts and pulleys. For example, a vertical stepper motor 272 is coupled to the piston assembly 110 by a primary vertical drive belt 225, which is coupled by a pulley system to a secondary vertical drive belt 226. The secondary vertical drive belt 226 (also referred to as a vertical timing belt) is coupled to the piston assembly 110 to move the piston assembly 110 along the vertical guides 224. Additionally, a horizontal stepper motor 260 is coupled to the piston assembly 110 by a primary horizontal drive belt 227, which is coupled by a pulley system to a secondary horizontal drive belt 228. The secondary horizontal drive belt 228 (also referred to as a horizontal timing belt) is coupled to the piston assembly 110 to move the piston assembly 110 along the horizontal guides 242. In this context, "horizontal" refers to a directly along or parallel to the X-axis illustrated in FIGS. 2A-2E, and "vertical" refers to a directly along or parallel to the Y-axis illustrated in FIGS. 2A-2E. Neither term should be understood as limiting.

The example illustrated in FIGS. 2A-2E also shows several types of interfaces 128, including a power switch 230, a pressure gauge 232, a power connector 234, programming buttons 236, status indicators 238, and a data interface 212. As described with reference to FIG. 1, the interfaces 128 may include more interfaces, fewer interfaces or different interfaces that those illustrated in FIGS. 2A-2E. In FIGS. 2A-2E, the data interface 212 is coupled to the controller 126 to enable the controller 126 to send data to or receive data from an external device, such as a workstation or server. The pressure gauge 232 provides a visual indication of the pressure regulator setting, the pressure of the pressurized fluid, or both. The power connector 234 enables coupling the device 102 to an external power source, and power to the device 102 may be enabled or disabled using the power switch 230. The programming buttons 236 enable an operator to provide input to program a test sequence, initiate the test sequence, or both. The status indicators 238 may provide a visual indication of a status of the device 102 (e.g., whether power is turned on, whether the device 102 is ready to run a test sequence, whether the device 102 is communication with or connected to an external computing device), a visual indication of a status of a test (e.g., whether a connector is being tested), a visual indication of a status of a test sequence (e.g., whether the test sequence has been programmed, initiated or completed), a visual indication of a test result (e.g., whether a particular contact passed or failed a test, whether a particular connector passed or failed a test sequence, or whether the particular contact or the particular connector should undergo further testing or inspection), or a combination thereof.

FIGS. 2A-2E also illustrate that the connector adaptor 106 may be configured to couple to more than one connector at a time. To illustrate, in FIG. 2B, the connector adaptor 106 is coupled to a first connector (e.g., via a first connector interface) and includes a second connector interface 240 to couple to a second connector. In this implementation, two or more connectors can be tested concurrently or in sequence without changing the connector adaptor 106. Additionally, in some implementations, the piston assembly 110 includes more than one piston 112 and probe tip 114 to enable simultaneous or concurrent testing of two or more contacts. The two or more contacts may be from the same connector (e.g., the connector 150) or from different connectors (e.g., the connector 150 and another connector, not shown). For example, in such implementations, a first piston and a second piston may be coupled to the piston assembly 110. The first piston may be spaced apart from the second piston by a distance that corresponds to an integer multiple of a distance between contacts (e.g., the distance between the first opening 152 and the second opening 162 in FIG. 1). The distance between the pistons may be fixed, manually adjustable, or adjustable responsive to a signal from the controller 126. In this implementation, each piston may be associated with a test actuator 142 so that the two pistons can be actuated separately. Alternatively, the two pistons may be coupled to a single test actuator 142 so that the two pistons are actuated at the same time.

Thus, the specific example of the device 102 illustrated in FIGS. 2A-2E enables automated testing of the contacts 156, 166 of the connector 150. The automated testing is repeatable because the amount of force used to test each of the contacts 156, 166 can be controlled. Further, the automated testing can be performed in a manner that allows statistically reliable sampling, which may improve (or document) overall reliability of connectors subjected to the testing.

Figure 3:
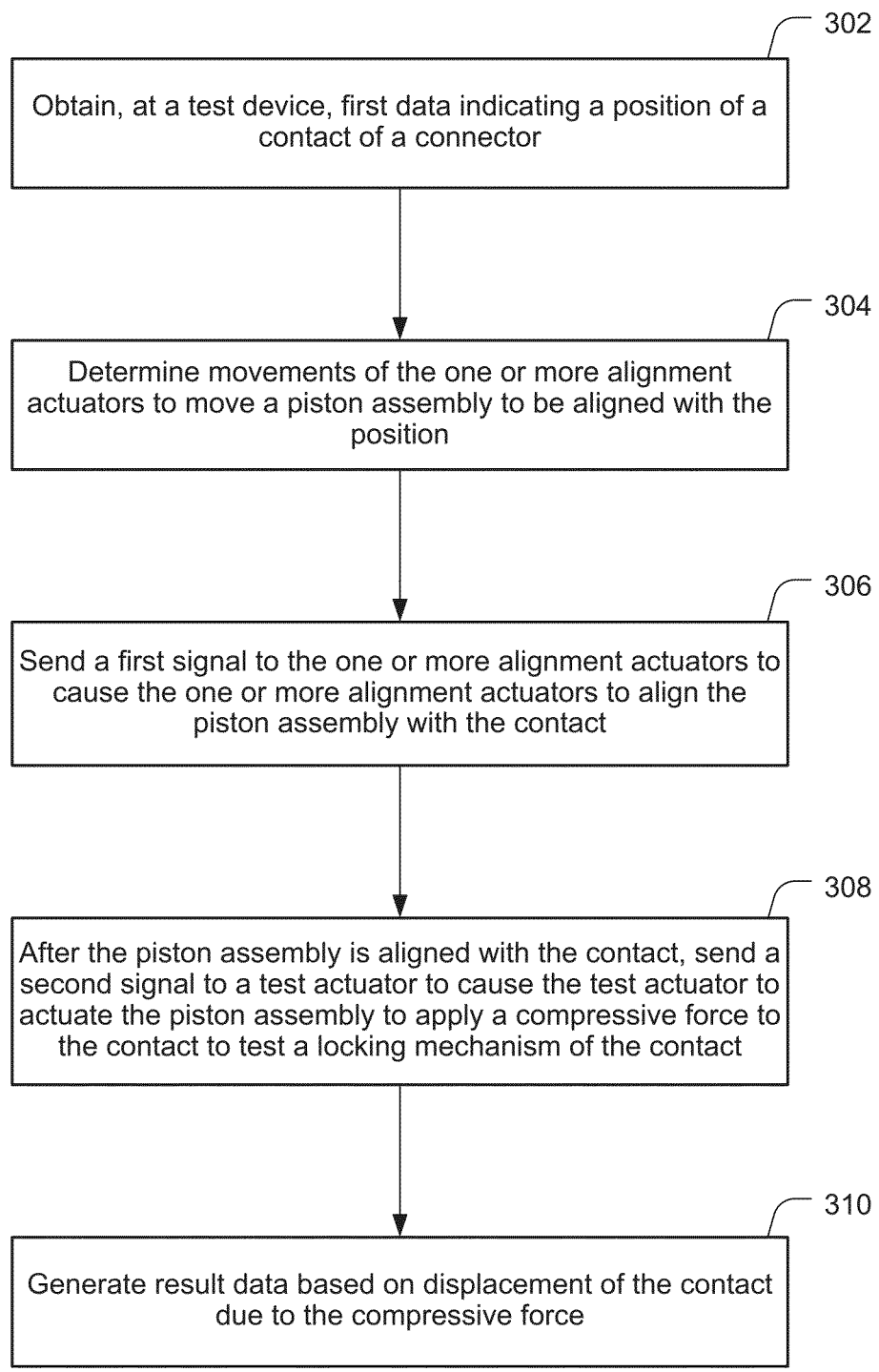
FIG. 3 is a flow chart of a method of testing a contact of a connector according to a particular embodiment.

FIG. 3 is a flow chart of a method 300 of testing a contact of a connector according to a particular embodiment. In some implementations, the method 300 is performed by the device 102 of FIG. 1 or 2A-2E, or by a component of the device 102, such as the controller 126.

The method 300 includes, at 302, obtaining first data indicating a position of a contact of a connector. For example, the first data 134 may be obtained by reading the first data 134 from the memory 130 of FIG. 1. In another example, the first data 134 by be obtained via input received from one of the interfaces 128.

The method 300 includes, at 304, determining movements of the one or more alignment actuators 122 to move the piston assembly 110 to be aligned with the position. Determining the movements of the one or more alignments actuators may include determining a position of the piston assembly 110 relative to the contact to be tested (e.g., the first contact 156). For example, a current position of the piston assembly 110 may be retained in a memory accessible to the controller 126, such as the memory 130. Alternatively, the controller 126 may move the piston assembly 110 to a known and detectable location to determine the position of the piston assembly 110. To illustrate, the controller 126 may cause the piston assembly 110 to move to a home position such that the limit switch 270 is actuated. After determining the position of the piston assembly 110 and the position of the contact to be tested (e.g., the first contact 156), the movements of the alignment actuators 122 to align the probe tip 114 with the first contact 156 may be calculated. To illustrate, for the device 102 illustrated in FIGS. 2A-2E, a number of stepper motor counts for the vertical stepper motor 272 may be determined to align the probe tip 114 vertically with the first contact 156, and a number of stepper motor counts for the horizontal stepper motor 260 may be determined to align the probe tip 114 horizontally with the first contact 156.

The method 300 includes, at 306, sending a first signal from the controller to the one or more alignment actuators. The first signal causes the one or more alignment actuators to align the piston assembly 110 with the contact to be tested (e.g., the first contact 156). For example, the controller 126 in FIGS. 2A-2E may send the signal to the vertical stepper motor 272 or to the horizontal stepper motor 260, or may send signals to each of the vertical and horizontal steeper motors 272, 260. Responsive to the signal or signals, the alignment actuators may move the piston assembly into alignment with the contact to be tested (e.g., the first contact 156).

The method 300 includes, at 308, after the piston assembly is aligned with the contact to be tested (e.g., the first contact 156), sending a second signal from the controller to a test actuator. The second signal causes the test actuator to actuate the piston assembly 110 to apply a compressive force to the contact (e.g., the first contact 156) to test a locking mechanism (e.g., the first locking mechanism 154) of the contact. For example, the controller 126 may send a signal to an electromechanical actuator to apply a mechanical or electromagnetic force to the piston 112. As another example, the controller 126 may send the signal to a valve or solenoid to supply a pressurized fluid to the piston 112. A magnitude of the compressive force applied by the piston 112 may be limited. For example, a pressure regulator 118 may limit the pressure of the pressurized fluid (e.g., based on a pressure regulator setting), thereby limiting the magnitude of the compressive force generated by the piston 112.

The method 300 includes, at 310, generating results data based on displacement of the contact (e.g., the first contact 156) due to the compressive force. For example, the results data may be generated automatically based on displacement of the first contact 156 (or the wire 206 attached to the first contact 156) detected by the position detector 140. In this example, the displacement may be compared to a threshold (e.g., a pass or fail criteria) to generate the results data. Alternatively, or in addition, an operator may provide input (via one of the interfaces 128) to indicate that the first contact 156 passed or failed the test based on observation of the first contact 156 (or the wire 206) during application of the compressive force. The results data 138 may be stored at a memory of the device 102 (e.g., the memory 130), may be used to generate an output via one or more of the interfaces 128, or both. For example, the results data 138 may be sent via the data interface 212 to another computing device. As another example, one or more lights of the status indicators 238 may be illuminated based on the results data 138.

In some embodiments, the method 300 also includes obtaining (e.g., determine based on the test operation data 132) second data that indicates a number of test repetitions to be performed on the first contact 156, and after sending the second signal, sending one or more additional signals from the controller 126 to the test actuator 142 to cause the compressive force to be applied to the first contact 156 a number of times corresponding to the number of test repetitions. For example, the memory 130 may store data specifying an entire test sequence. The test sequence may indicate that a particular contact is to be test multiple times. In this example, the controller 126 may access the data specifying the test sequence from the memory 130 and may repeat testing of the contact until the compressive force has been applied to the contact a number of times corresponding to the number of test repetitions specified by the test sequence. The test sequence may be structured based on a quality assurance test specification. For example, the test sequence may test fewer than all of the contacts of the connector 150 (e.g., following a sampling plan), may test certain contacts multiple times, or both.

Thus, FIG. 3 illustrates an example of a method of testing a contact of the connector 150. The method 300 may be automatically repeated multiple times to test each contact of the connector 150 or to test a subset of the contacts of the connector 150. The method 300 enables use of a device, such as the device 102, to automate the testing. The automated testing is repeatable since the amount of force used to test each of the contacts can be controlled. Further, the automated testing can be performed in a manner that allows statistically reliable sampling, which may improve (or document) overall reliability of connectors subjected to the testing.

Figure 4:
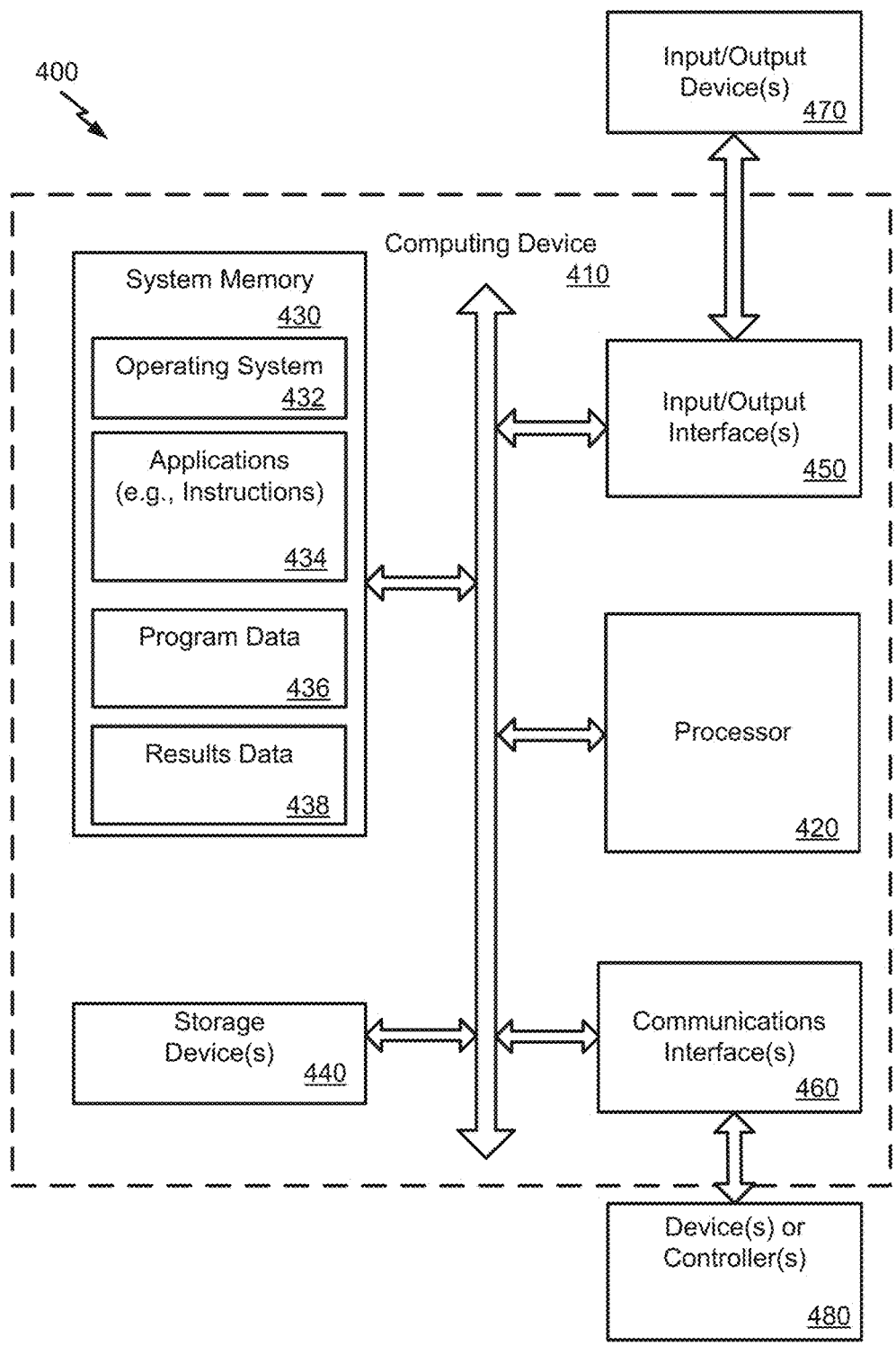
FIG. 4 is an illustration of a block diagram of a computing environment including a computing device configured to support embodiments of computer-implemented methods and computer-executable program instructions (or code) according to the present disclosure.

FIG. 4 is an illustration of a block diagram of a computing environment 400 including a computing device 410 configured to support embodiments of computer-implemented methods and computer-executable program instructions (or code) according to the present disclosure. For example, the computing device 410, or portions thereof, may execute instructions according to the method 300 of FIG. 3. In a particular embodiment, the computing device 410 of FIG. 4 corresponds to the controller 126 of FIGS. 1-2E. Alternatively, the computing device 410 of FIG. 4 may be coupled to the controller 126 via one or more of the interface 128. For example, the computing device 410 may be coupled to the device 102 via one or more communication interfaces 460.

The computing device 410 includes a processor 420. The processor 420 is configured to communicate with the system memory 430, one or more storage devices 440, one or more input/output interfaces 450, the one or more communications interfaces 460, or a combination thereof. The system memory 430 includes volatile memory devices (e.g., random access memory (RAM) devices), nonvolatile memory devices (e.g., read-only memory (ROM) devices, programmable read-only memory, and flash memory), or both. The system memory 430 includes an operating system 432, which may include a basic/input output system for booting the computing device 410 as well as a full operating system to enable the computing device 410 to interact with users, other programs, and other devices. The system memory 430 may include one or more applications 434 which may be executable by the processor 420. For example, the one or more applications 434 may include instructions executable by the processor 420 to perform various operations. Further, the system memory 430 may include program data 436 usable for performing various operations described herein. The system memory 430 may also include results data 438 generated based on one or more connector tests. The results data 438 may be generated by the processor 420 (e.g., when the computing device 410 corresponds to the controller 126) or may be generated by another device and received via the one or more communication interfaces 460. In a particular embodiment, the system memory 430 or the storage devices 440 corresponds to, includes, or is included within the memory 130 of FIG. 1.

As an example, the application(s) 434 may include instructions executable by the processor 420 to obtain data (e.g., the first data 134 of FIG. 1) indicating a position of a contact of a connector. The applications 434 may also be executable by the processor 420 to determine movements of one or more alignment actuators 122 to move a piston assembly 110 to be aligned with the position. The applications 434 may also be executable by the processor 420 to send (e.g., via the input/output interface 450, via the communication interfaces 460, or via one or more other interfaces) a first signal to the one or more alignment actuators 122, where the first signal causes the one or more alignment actuators 122 to align the piston assembly 110 with the contact of the connector. The applications 434 may also be executable by the processor 420 to, after the piston assembly 110 is aligned with the contact, send (e.g., via the input/output interface 450, via the communication interfaces 460, or via one or more other interfaces) a second signal to a test actuator, where the second signal causes the test actuator to actuate the piston assembly 110 to apply a compressive force to the contact to test a locking mechanism of the contact. The applications 434 may also be executable by the processor 420 to generate results data 138 based on displacement of the contact due to the compressive force. The applications 434 may also be executable by the processor 420 to limit a magnitude of the compressive force (e.g., based on a pressure regulator setting). The applications 434 may also be executable by the processor 420 to obtain second data 136 that indicates a number of test repetitions to be performed on the contact. The applications 434 may also be executable by the processor 420 to, after sending the second signal, send (e.g., via the input/output interface 450, via the communication interfaces 460, or via one or more other interfaces) one or more additional signals to the test actuator to cause the compressive force to be applied to the contact a number of times corresponding to the number of test repetitions.

The processor 420 may also communicate with one or more storage devices 440. For example, the one or more storage devices 440 may include nonvolatile storage devices, such as magnetic disks, optical disks, or flash memory devices. The storage devices 440 may include removable memory devices, non-removable memory devices, or both. The storage devices 440 may be configured to store the operating system 432, images of the operating system 432, the applications 434, the program data 436, or a combination thereof. In a particular embodiment, the system memory 430, the storage devices 440, or both, include tangible computer-readable media.

The processor 420 may communicate with one or more input/output interfaces 450. The one or more input/output interfaces enable the computing device 410 to communicate with one or more input/output devices 470 to facilitate user interaction. For example, the input/output interfaces 450 may correspond to, include, or be included within the interfaces 128 of FIG. 1. The processor 420 may detect interaction events based on user input received via the input/output interfaces 450. Additionally, the processor 420 may send a display to a display device via the input/output interfaces 450. The processor 420 may communicate with devices or controllers 480 via the one or more communications interfaces 460.

Embodiments described above are illustrative and do not limit the disclosure. It is to be understood that numerous modifications and variations are possible in accordance with the principles of the present disclosure.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, method steps may be performed in a different order than is shown in the figures or one or more method steps may be omitted. Accordingly, the disclosure and the figures are to be regarded as illustrative rather than restrictive.

Moreover, although specific embodiments have been illustrated and described herein, it is to be appreciated that any subsequent arrangement designed to achieve the same or similar results may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, the claimed subject matter may be directed to less than all of the features of any of the disclosed embodiments.

What is claimed is:

1. A device to test a contact of a connector, the device comprising:
   a frame;
   a connector adaptor coupled to the frame and configured to retain the connector;
   one or more alignment actuators coupled to the frame;
   a piston assembly movable relative to the connector by the one or more alignment actuators, the piston assembly configured to apply a compressive force to the contact to test a locking mechanism of the contact;
   a memory storing test operation data identifying multiple contacts of the connector that are to be tested and indicating a number of test repetitions for each contact of the multiple contacts; and
   a controller configured to cause the piston assembly to apply the compressive force to the contact a number of times corresponding to the number of test repetitions for the contact indicated in the test operation data.

2. The device of claim 1, wherein the connector adaptor is configured to couple to the connector such that a wire associated with the contact extends from a first side of the connector adaptor, and wherein the piston assembly applies the compressive force from a second side of the connector adaptor, wherein the first side is opposite the second side.

3. The device of claim 1, wherein the piston assembly includes a pneumatically actuated piston.

4. The device of claim 3, wherein the pneumatically actuated piston is coupled to a pressure regulator and a pressurized fluid source to control a magnitude of the compressive force applied by the pneumatically actuated piston to the contact.

5. The device of claim 3, further comprising a position limit switch configured to limit a range of motion of the pneumatically actuated piston.

6. The device of claim 1, further comprising a probe tip coupled to the piston assembly, the probe tip configured to fit within an opening of the connector to access the contact.

7. The device of claim 1, further comprising one or more position detectors configured to generate result data based on displacement of the contact due to the compressive force.

8. The device of claim 1, wherein the connector includes multiple contacts and the piston assembly includes at least two pistons spaced apart by a distance that is an integer multiple of a distance between two contacts of the connector.

9. The device of claim 1, wherein the controller is further configured to:
   obtain first data indicating a position of the contact; and
   send a first signal based on the first data to the one or more alignment actuators, wherein the one or more alignment actuators are configured to align the piston assembly with the contact based on the first signal.

10. A device to test a contact of a connector, the device comprising:
    a frame;
    a connector adaptor coupled to the frame and configured to retain the connector;
    one or more alignment actuators coupled to the frame;
    a piston assembly movable relative to the connector by the one or more alignment actuators, the piston assembly configured to apply a compressive force to the contact to test a locking mechanism of the contact;
    a controller configured to:
      obtain first data indicating a position of the contact; and
      send a first signal based on the first data to the one or more alignment actuators, wherein the one or more alignment actuators are configured to align the piston assembly with the contact based on the first signal; and
    a test actuator coupled to the piston assembly, wherein the controller is further configured to, after the one or more alignment actuators align the piston assembly with the contact, send a second signal to the test actuator to cause the piston assembly to apply the compressive force to the contact.

11. The device of claim 10, further comprising a memory accessible to the controller, the memory storing test operation data identifying multiple contacts of the connector that are to be tested and indicating a number of test repetitions for each contact of the multiple contacts, wherein the controller is further configured to cause the piston assembly to apply the compressive force to the contact a number of times corresponding to the number of test repetitions for the contact indicated in the test operation data.

12. The device of claim 1, wherein the contact includes a pin contact or a socket contact.

13. The device of claim 1, further comprising one or more clamps to removeably couple the connector adaptor to the frame.

14. A method of testing a contact of a connector, the method comprising:
    sending a first signal from a controller of a test device to one or more alignment actuators of the test device, wherein the first signal causes the one or more alignment actuators to align a piston assembly of the test device with the contact of the connector;
    after the piston assembly is aligned with the contact, sending a second signal from the controller to a test actuator of the test device, wherein the second signal causes the test actuator to actuate the piston assembly to apply a compressive force to the contact to test a locking mechanism of the contact; and
    after sending the second signal, generating result data based on displacement of the contact due to the compressive force.

15. The method of claim 14, further comprising, before sending the first signal:
    obtaining first data indicating a position of the contact; and
    determining, based on the first data and based on calibration data, movements of the one or more alignment actuators to move the piston assembly to be aligned with the position, wherein the first signal is based on the movements.

16. The method of claim 15, wherein the one or more alignment actuators include stepper motors and the movements include stepper motor counts.

17. The method of claim 15, further comprising obtaining second data that indicates a number of test repetitions to be performed on the contact, and further comprising, after sending the second signal, sending one or more additional signals from the controller to the test actuator to cause the compressive force to be applied to the contact a number of times corresponding to the number of test repetitions.

18. The method of claim 17, further comprising determining the second data based on test operation data stored in a memory accessible to the controller.

19. A method of testing a contact of a connector, the method comprising:
   sending a first signal from a controller of a test device to one or more alignment actuators of the test device, wherein the first signal causes the one or more alignment actuators to align a piston assembly of the test device with the contact of the connector;
   after the piston assembly is aligned with the contact, sending a second signal from the controller to a test actuator of the test device, wherein the second signal causes the test actuator to actuate the piston assembly to apply a compressive force to the contact to test a locking mechanism of the contact; and
   limiting a magnitude of the compressive force based on a pressure regulator setting.

20. The method of claim 14, wherein the result data is generated by comparing the displacement to a threshold.

* * * * *

UNITED STATES PATENT AND TRADEMARK OFFICE
CERTIFICATE OF CORRECTION

PATENT NO. : 10,082,447 B2
APPLICATION NO. : 15/068347
DATED : September 25, 2018
INVENTOR(S) : Curtis R. Estevo et al.

Page 1 of 1

It is certified that error appears in the above-identified patent and that said Letters Patent is hereby corrected as shown below:

On the Title Page

Item (72), "David Scott S. Wright" should read --David S. Wright--.

Signed and Sealed this
Twentieth Day of November, 2018

Andrei Iancu
*Director of the United States Patent and Trademark Office*